United States Patent
Ramm et al.

(10) Patent No.: US 6,284,627 B1
(45) Date of Patent: Sep. 4, 2001

(54) METHOD FOR WIRING SEMI-CONDUCTOR COMPONENTS IN ORDER TO PREVENT PRODUCT PIRACY AND MANIPULATION, SEMI-CONDUCTORS COMPONENT MADE ACCORDING TO THIS METHOD AND USE OF SAID SEMI-CONDUCTOR COMPONENT IN A CHIP CARD

(75) Inventors: Peter Ramm, Pfaffenhofen; Reinhold Buchner, Unterfoehring, both of (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/508,712

(22) PCT Filed: Sep. 4, 1998

(86) PCT No.: PCT/DE98/02645
§ 371 Date: Apr. 10, 2000
§ 102(e) Date: Apr. 10, 2000

(87) PCT Pub. No.: WO99/16131
PCT Pub. Date: Apr. 1, 1999

(30) Foreign Application Priority Data

Sep. 19, 1997 (DE) .............................................. 197 41 507
Oct. 22, 1997 (DE) .............................................. 197 46 641

(51) Int. Cl.$^7$ .............................. H01L 21/30; H01L 21/46
(52) U.S. Cl. .................... 438/455; 438/106; 438/109; 438/459; 438/977
(58) Field of Search ............................. 438/106, 109, 438/455, 459, 977

(56) References Cited

U.S. PATENT DOCUMENTS

| | | | |
|---|---|---|---|
| 3,762,038 | * 10/1973 | Ruggiero | 29/577 |
| 5,030,796 | 7/1991 | Swanson et al. | 174/52.2 |
| 5,258,334 | 11/1993 | Lantz | 437/238 |

(List continued on next page.)

FOREIGN PATENT DOCUMENTS

| | | | |
|---|---|---|---|
| 44 33 845 | 3/1996 | (DE) | H01L/21/98 |
| 0510433 | 10/1992 | (EP) | H01L/25/18 |
| 0582850 | 2/1994 | (EP) | H01L/23/552 |
| 0771023 | 5/1997 | (EP) | H01L/21/56 |

OTHER PUBLICATIONS

Grounded Body SOI(GBSOI)nMOSFET by Wafer Bonding, Wong-gu Kang et al., IEEE Electron Device Letters, vol. 16, No. 1, Jan. 1993.

Radiation Tolerance of Double Layer Field Oxides by K. Neumeier et al.; 91–57939/92503.00 IEEE 1992.

*Primary Examiner*—John F. Niebling
*Assistant Examiner*—David A Zarneke
(74) *Attorney, Agent, or Firm*—Karl Hormann

(57) ABSTRACT

The invention relates to a method of fabricating a metallized circuit structure for preventing product piracy and product manipulation, a semiconductor component fabricated by the method as well as the use of the semiconductor component in a chip card. The method may be practiced with CMOS-compatible standard Semiconductor technologies and complicates the use of so-called reverse engineering for appropriating foreign technology knowhow or for reading and/or manipulating data stored in the component. It is also possible by the method in accordance with the invention to fabricate a semiconductor component protected from ambient influences. In the method in accordance with the invention the component layer in the substrate (1) is processed up to a metallization complex. Thereafter, the front surface of the component substrate (1) thus obtained is connected to the front surface of a handling substrate (6) and the component substrate (1) is thinned from the rear side. Thereafter, following an appropriate lithographic step, via holes (9) are etched and metallized through the remaining thin component substrate layer down to the areas to be contacted so that electrical contacts to the component are produced.

20 Claims, 5 Drawing Sheets

U.S. PATENT DOCUMENTS

| | | | |
|---|---|---|---|
| 5,399,441 | 3/1995 | Bearinger et al. | 428/689 |
| 5,489,554 * | 2/1996 | Gates | 437/208 |
| 5,563,084 | 10/1996 | Ramm et al. | 437/51 |
| 5,766,984 * | 6/1998 | Ramm et al. | 438/109 |

* cited by examiner

METHOD FOR WIRING SEMI-CONDUCTOR COMPONENTS IN ORDER TO PREVENT PRODUCT PIRACY AND MANIPULATION, SEMI-CONDUCTORS COMPONENT MADE ACCORDING TO THIS METHOD AND USE OF SAID SEMI-CONDUCTOR COMPONENT IN A CHIP CARD

BACKGROUND OF THE INVENTION

1. Field of the Invention

The present invention relates to a method of fabricating a semiconductor component provided with one or more conductive structural elements having the characteristics of the generic portion of patent claim 1 as well as to a semiconductor element provided with one or more structural elements which may be fabricated by such a method. More particularly, the present invention relates to a method of fabricating a metallized semiconductor circuit structure which may be practiced with CMOS-compatible standard semiconductor technologies and which complicates the use of so-called reverse engineering for the appropriation of foreign technology knowhow or for the selection and/or manipulation of data stored in the component.

2. The Prior Art

A method incorporating the characteristics of the generic portion of patent claim 1 is known, for instance, from G. Schumiki, P. Seegebrecht "Prozeβtechnologie", Springer-Verlag, Berlin, ISBN 3-540-17670-5. FIG. 5 shows a semiconductor component fabricated by such a method. In FIG. 5, the layers identified by reference numeral 12 are conductive layers built-up, for instance, of doped semiconductor material or of doped polysilicon layers, and the layers identified by reference numeral 13 are metallizations. Wiring 13 of the component is realized by depositing and structuring metal layers and intermediate insulation layers 11. In this modular method via holes are etched through an insulation layer 11 to a conductive structure 12, 13, followed by precipitation of a metall layer and subsequent structuring of conductor runs 13 and covering by a further insulation layer 11.

The problems inherent in such semiconductor components are, on the one hand, that the design and arrangement of the conductor runs within the component can be easily identified by reverse engineering techniques and that the method of fabricating such a semiconductor component can easily by forged by third parties.

For instance, semiconductor components can be optically radiographed, and their design can be easily "seen through" by electron beam microscopy utilizing either imaging methods or by tracing a flowing current. It is also customary mechanically or chemically to remove layer after layer of a semiconductor component and then to examine every resulting surface.

Taking into consideration the enormous development costs of novel semiconductor chips, it is clear that there exists a great need for ways of curtailing the likelihood of success of such reverse engineering methods.

A further problem resides in the fact that the utilization of such semiconductor components in chip cards opens the possibility of manipulation by third parties, which significantly lowers the security of chip cards. It is possible, for instance, by special techniques to read or alter, as the case may be, the data stored in the chip cards.

Steps hitherto taken for avoiding the problems mentioned supra consist, for instance, in improving the used PIN codes by the application of a secret number with an increased number of digits, in order to prevent unauthorized use of chip cards.

Attempts to solve the problem connected with reverse engineering methods seek to structure the design of chip cards as complicated as possible in order to reduce the possibilities of success of the previously mentioned optical penetration or electron microscopy methods. However, attempts of structuring a circuit to be fabricated in as complicated a manner as possible may lead to the problem of a markedly reduced level of integration of the circuit and that the fabrication process becomes technologically complex. More specifically, the level of integration may be enhanced by arranging several metallization planes in superposition. Because of the surface topography this does, however, also require an adaptation to given sizes of the circuit runs which results in a deterioration of the integration density of the metallization in the corresponding device.

Moreover, from U.S. Pat. No. 5,563,084, corresponding to German Patent 44 33 845 there is known a method of fabricating a three-dimensional integrated circuit. In accordance with this method, using a handling substrate fully processed chips are applied to a further substrate which may also contain several layers of components. To increase yield, the functioning of individual chips is tested before they are assembled.

OBJECTS OF THE INVENTION

It is, therefore, an object of the present invention further to improve the known method of fabricating semiconductor components provided with one or more conductive structural elements, such that the complexity of the circuit may be increased without deterioration of the integration density and without unduly increasing the technological complexity of the method. A further object of the invention is to provide a semiconductor component of more complex circuitry and high integration density.

SUMMARY OF THE INVENTION

In accordance with the present invention, the object is accomplished by the features hereinafter described in detail. In one of its aspects the present invention provides a method of fabricating a semiconductor component comprising one or more conductive structural elements and protected from ambient influences, and a semiconductor component provided with one or more conductive structural elements and as well as the use of these semiconductor components in a chip card.

Hence, the present invention relates to a method of fabricating a semiconductor component provided with one or more structural elements including the steps of applying and structuring of layers contained in the semiconductor component on a first substrate;

connecting the surface of the first substrate to which these individual layers have been applied to a second substrate;

providing the or one of the several conductive structural elements on the free surface of the first substrate, this step being carried out in a way yielding a functional electrical contact between the conductive structural element and the component; and finalizing the semiconductor component.

In the method in accordance with the invention the layer of the component in the substrate is processed down to a metallization plane. That is to say the starting point always is a component layer within a substrate without metallization, with one or more metallization planes.

Thereafter, the front surface of the component substrate thus obtained is joined to the front surface of a handling substrate, and, additionally, the component substrate may be thinned down from its rear surface. The following application of electrical contacts to the component, i.e. the provision of metallization planes following one or more metallization planes on the component layer within the substrate without metallization, is preferably carried out by etching, down to the contacting areas, and subsequently metallizing via holes, after an appropriate lithographic step, through the optionally thinned component substrate layer.

The sequence of the steps of the method in accordance with the invention leads to the insertion of an additional substrate into the component. The substrate may either be the component substrate itself or, in an iterative repetition of the method steps according to patent claim 12, it may be that handling substrate which was inserted during the previous iteration step and has thus taken on the role of the component substrate. In accordance with a preferred embodiment the additional substrate may be arranged between the semiconductor component per se and the metallization plane or planes provided for the electrical contacting of the semiconductor component. The additional substrate may, however, also be arranged between individual metallization planes provided for the electrical contacting of the semiconductor component. In this context, the term "metallization planes" embraces all conductive structural elements of the semiconductor component, such as, for instance, conductor runs, wirings, etc.

Such an insertion of an additional substrate makes it possible significantly to increase the complexity of the resultant circuitry without deterioration of the level of integration of the device or rendering the method of fabrication unduly complex.

In accordance with the method of the invention the component substrate and the handling substrate are connected to each other sufficiently strongly to make subsequent separation of the stack of layers impossible without destruction.

In accordance with a preferred embodiment the substrate additionally inserted into the component is made of a material which is not transparent in the range of visible wavelengths, such as, e.g., silicon, thus preventing the application of optical penetration methods. The additional substrate may either be made of, or additionally contain, a material which is not transparent in the range of shortwave radiation, e.g. x-rays, thus preventing the application of x-ray penetration methods. In accordance with the present invention, the additional substrate may also be a so-called SOI-substrate so that, in an etching step, the buried insulating layer acts as an etch stop. In this manner, the fabrication method may be further simplified and its costs may be reduced. The use of an SOI-substrate further makes it possible to etch the additional substrate more uniformly.

For the connection of the front surface of the component substrate with the handling substrate, the front surface of the component substrate is preferably provided with an adhesion layer. The adhesion layer may then also assume the function of a passivation and/or planarizing layer. The component substrate is thereafter thinned down from its rear surface. Thinning may be performed, for instance, by wet chemical etching or by mechanical or chemo-mechanical grinding. The substrate stack obtained following connection and thinning may thereafter be processed further like a standard substrate, the surface of the thinned component substrate now constituting the front surface. This front surface is initially insulated by precipitation of a dielectric layer which in certain circumstances may make the application of an SOI-substrate on this insulation layer unnecessary. Following a standard lithographic step, via holes are etched through the insulating layer and the thin component substrate layer down to the contacting areas, and the side surfaces of the via holes are insulated. Finally, by way of these contacts the wiring is fabricated by standard metallization which may consist of one or more metallization planes. In this context, the contacts may be realized between any metallization planes of the component substrate or the wiring. Finally, in keeping with common practice in the state of the art of fabricating components, the substrate disc may be reduced to the required thickness by mechanically and/or chemically thinning the substrate stack from the side of the handling substrate.

By contrast to current state of the art methods of multiple layer wirings, the method in accordance with the invention advantageously counteracts the possibilities of product piracy and product manipulation in view of the fact that portions of the wiring of the component are moved to that side of the component substrate which is positioned opposite the component per se or opposite further portion of the component wiring. By comparison, in known methods of multiple layer wirings structured metal layers arranged in superposition are insulated from each other by optically transparent dielectric layers, e.g. $SiO_2$, as shown in FIG. 5.

By insertion of the additional substrate which, as previously described, may be the component substrate itself or a handling substrate, the complexity of the wiring may be increased which leads to preventing or complicating the techniques commonly used for analyzing the circuit structure or the techniques for manipulating data stored in the components. If, in addition, the additional substrate is optically opaque, methods of optical penetration or analysis by electron microscopy are rendered useless and methods of manipulating or reading data stored in the circuit or in the chip card can no longer by applied.

Moreover, the method in accordance with the invention may be practiced for fabricating a semiconductor component which is protected from ambient influences. More particularly, the first substrate layer which now constitutes an intermediate layer within the semiconductor component, serves as a protective layer against ambient influences. By selection of an appropriate material for the first substrate this protective function may be improved.

Furthermore, with a view to improving the protective function additional protective layers may be applied prior to the step of providing the or one of the several conductive structural elements. Examples of such protective layers may be passivation layers made, e.g., of $SiO_2$.

Particularly in connection with an iterative repetition of the method steps, i.e. if several substrate layers are inserted in the component, it is possible with different appropriately selected substrate and/or additional layers to encapsulate the semiconductor component or portions thereof.

DESCRIPTION OF THE SEVERAL DRAWINGS

The present invention will hereinafter be described in greater detail with reference to the accompanying drawings.

DETAILED DESCRIPTION OF THE PREFERRED EMBODIMENTS

Figure 1:
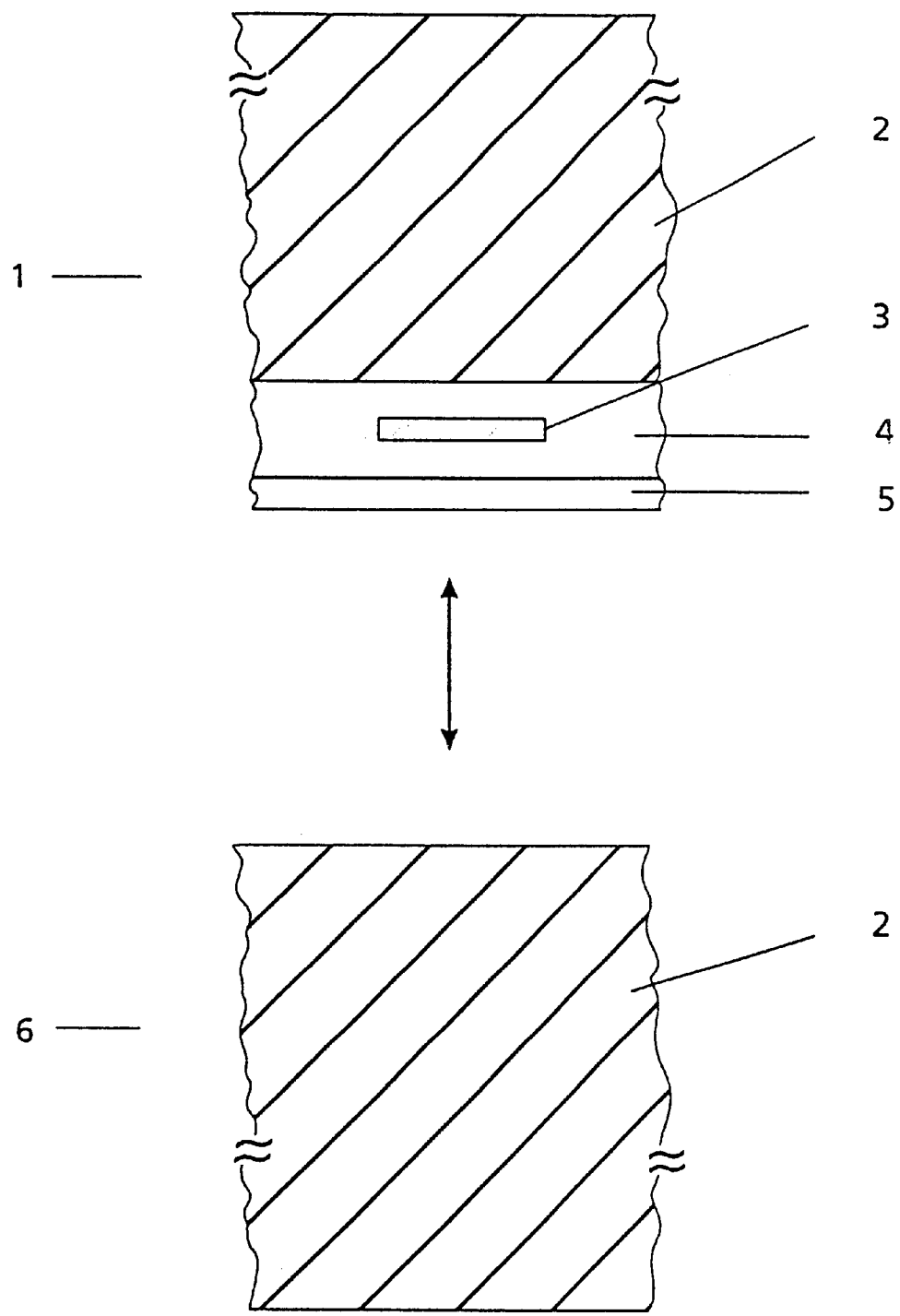
FIG. 1 shows a component substrate with completely processed MOS circuits and a metallization plane prior to its connection with an auxiliary substrate.

In FIG. 1, reference numeral 1 identifies a component substrate which incorporates, for instance, a silicon disc 2 with completely processed MOS-circuitry and a metallization plane 3. The metallization plane 3 is passivated by an oxide protection layer. The metallization includes, for instance, an aluminum alloy. A polyamide layer 5 is spun on the component disc as an adhesion layer so that the surface topography is planarized.

Planarization of the surface topography may alternatively have been provided prior to the application of the adhesion layer by a planarizing step. Thereafter, the component disc is connected to an auxiliary substrate 6, comprising, for instance, a further silicon disc. Thereafter, the thus obtained stack of discs is mechanically, wet chemically and/or chemo-mechanically thinned down from the side of the component substrate so that the remaining thickness of the silicon of the component substrate amounts to a few micrometers.

Figure 2:
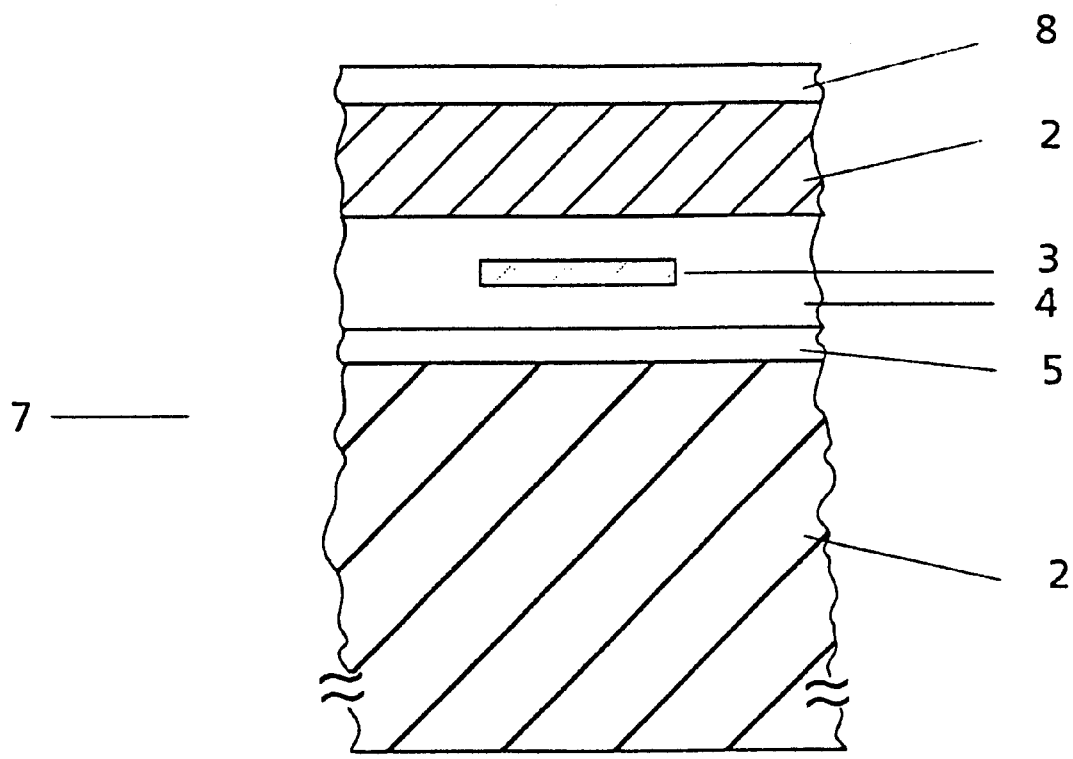
FIG. 2 shows the component substrate depicted in FIG. 1 after connection with the auxiliary substrate and thinning of the component substrate.

Following thinning, the stack of discs 7 shown, for instance, in FIG. 2, may be processed like a standard disc.

Figure 3:
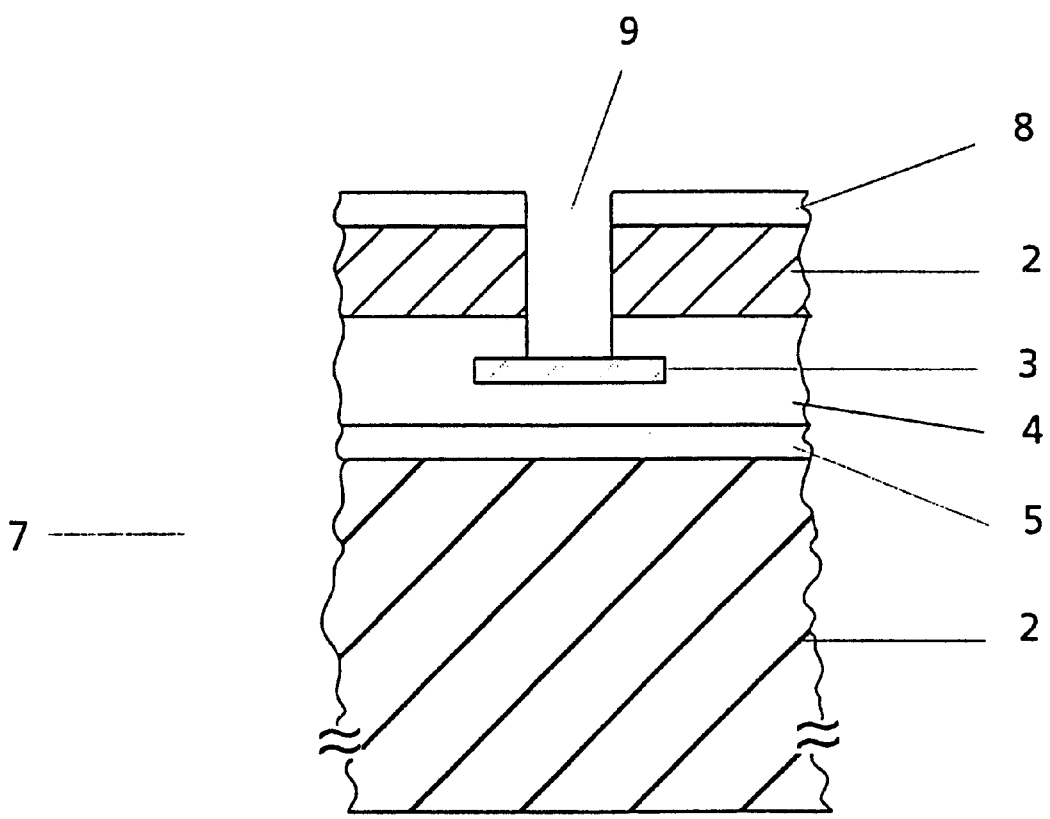
FIG. 3 shows the stack of discs depicted in FIG. 2 which is processed like a standard disc.
Figure 4:
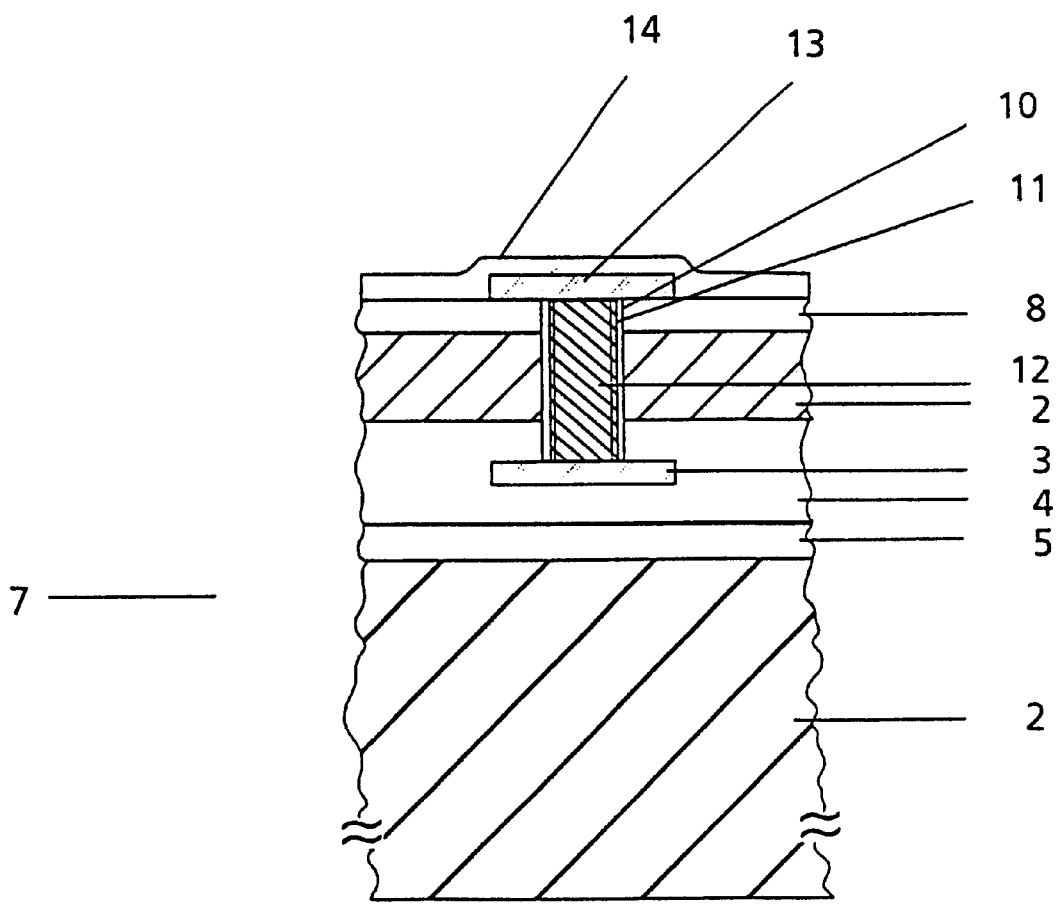
FIG. 4 shows the stack of discs depicted in FIG. 3 now provided on its surface with a wiring plane.
Figure 5:
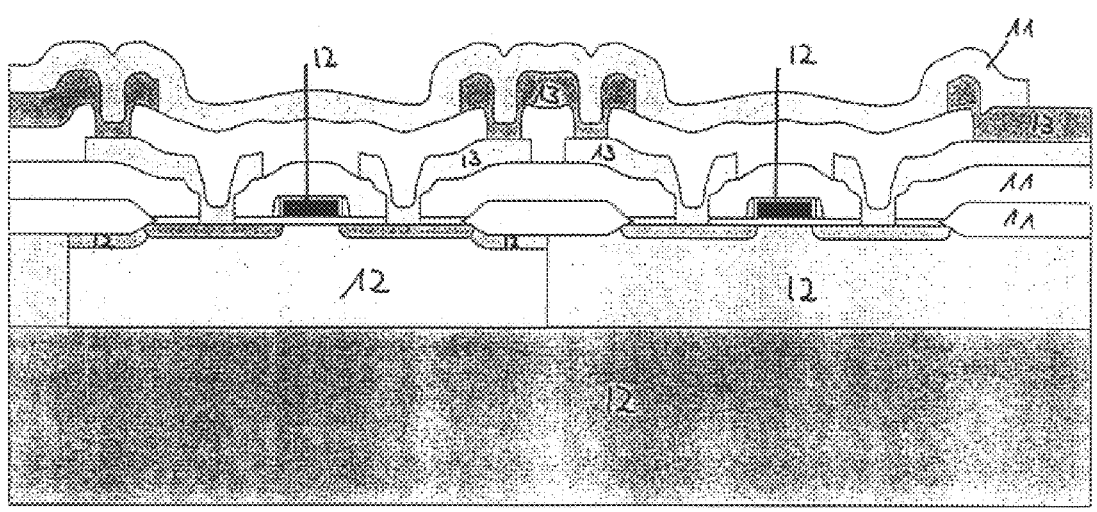
FIG. 5 shows a typical layer structure of a semiconductor component including several conductive structural elements fabricated by a standard method.

For instance, the silicon surface is passivated as, for instance, with an oxide layer 8. Following an appropriate lithographic step, via holes 9 are etched down to the areas to be contacted of the metallization, as shown in FIG. 3. Thereafter, as shown in FIG. 4, the sidewalls of the via holes are preferably insulated with insulating layers 10. In accordance with an especially preferred embodiment this is accomplished by a so-called spacer oxide process sequence which includes a conforming oxide precipitation and subsequent anisotropic reverse etching.

Providing the circuits with wring is accomplished, for instance, by precipitating a layer 11 of titanium nitride as an adhesion and Barrier layer for the subsequent tungsten metallization 12 which may take place by W-deposition, for instance. Thereafter, the tungsten/titanium nitride layer is removed from the surface of the substrate by the application of chemo-mechanical grinding with a CMP device, so that the remaining tungsten/titanium nitride plugs realize the vertical connection with the component metallization plane. Finally, the wiring of the component is carried out by a standard metallization process, for instance with an aluminum alloy 13 and following passivation 14, as shown in FIG. 4. The wiring of the component may also include several metallization planes. However, other methods of fabricating a wiring of the circuits are also conceivable. Finally, the stack of discs is thinned down, preferably mechanically, from the side of the auxiliary substrate to the required residual thickness of 180 μm, for instance.

It will be apparent to those skilled in the art that the invention as described above may be modified in numerous embodiments.

For instance, the auxiliary substrate 67 and/or the component substrate 1 may be processed and/or structured in different ways following an optional thinning. More particularly, virtual conductor runs comprising no contacts to the component may be fabricated in these substrates in order deliberately to furnish faulty data in attempted reverse engineering. Likewise is it possible to connect the planarized surface of the component processed in accordance with FIG. 4 with a further auxiliary substrate in order to insert a further auxiliary layer into the resultant component.

In wiring encompassing several wiring planes, these may in this manner be separated from each other by an additionally provided auxiliary substrate.

The semiconductor component fabricated by the method in accordance with the invention may be used to particular advantage in chip cards, as its specific construction significantly reduces the possibilities of manipulation from the outside. More particularly, forging by penetrating through the individual layers of the component with a metal pin for the purpose of reading and/or falsifying the data stored on the chip is rendered more difficult.

What is claimed is:

1. A Method of fabricating a semiconductor component provided with one or more conductive structural elements by the steps of applying and structuring metallization, protection and adhesion layers contained in the semiconductor component on a first surface of a first substrate, said first substrate having a free surface opposite said first surface; characterized by the steps of connecting the first surface of the first substrate on which the metallization, protection and adhesive layers are applied with a second substrate;

providing the or one of the several conductive structural elements on the free surface of the first substrate, this step being performed such that a functional electrical contact is realized between the conductive structural element and the component; and completing the semiconductor component.

2. The method of claim 1, characterized by the fact that the first substrate is not transparent in the range of visible wavelengths.

3. The method of claim 1, characterized by the fact that the first substrate is a Si-substrate.

4. The method of claim 1, characterized by the fact that the first substrate is a SOI-substrate.

5. The method of one of claims 1, characterized by the step of thinning the first substrate after the step of connecting the surface of the first substrate with the second substrate.

6. The method of claim 5, characterized by the fact the thinning is performed by etching, mechanical or chemo-mechanical grinding or a combination of these methods.

7. The method of one of claim 1, characterized by the fact that the step of connecting the surface of the first substrate with the second substrate includes the step of applying an adhesion layer.

8. The method of claim 7, characterized by the fact that the adhesion layer is a polyamide layer.

9. The method of claim 1, characterized by the fact that the step of connecting the surface of the first substrate with the second substrate is performed such that in the resultant semiconductor component the first substrate layer is arranged between the semiconductor component per se and the metallization plane or planes provided for the electrical contacting of the semiconductor component.

10. The method claim 1, characterized by the fact that the step for connecting the surface of the first substrate to the second substrate is performed such that in the resultant semiconductor component the first substrate layer is arranged between individual metallization planes provided for the electrical contacting of the semiconductor component.

11. The method of claim 1, characterized by the fact that the step of connecting the surface of the first substrate to the second substrate is performed such that in the resultant semiconductor component the first substrate layer is arranged between the metallization planes provided for the electrical contacting of the semiconductor component and a wiring provided for the electrical contacting of the metallization planes.

12. The method of claim 1, characterized by the fact that the step of completing the semiconductor component includes one or more steps of connecting the surface of the completed layer sequence to an $n^{th}$ substrate (n>2); and providing a further conductive structural element on the free surface of the $(n-1)^{st}$ substrate, this step being performed such that a functional electrical contact is realized between the conductive structural element and the component.

13. The method of claim 1, characterized by the step of structuring the first or $(n-1)^{st}$ substrate prior to the step of providing the first or one of several conductive structural elements on the free surface of the first or $(n-1)^{st}$ substrate.

14. The method of claim 1, characterized by the step of (partial) application of an additional conductive layer on the free surface of the first or $(n-1)^{st}$ substrate.

15. The method of claim 14, characterized by the step of connecting the substrate surface provided with the additional conductive layer to a further substrate.

16. The method of claim 1, characterized by several consecutive steps of (partial) application of an additional conductive layer on the free surface of the first or $(n-1)^{st}$ substrate and of connecting the substrate surface provided with the additional conductive layer to a further substrate.

17. The method of claim 1 of fabricating a semiconductor component provided with one or more conductive structural elements, which is protected from ambient influences.

18. The method of claim 17, characterized by the step of applying one or more additional protective layers prior to the step of providing the or one of the several conductive structural elements on the free surface of the first substrate.

19. A semiconductor component provided with one or more conductive structural elements, characterized by the fact that the semiconductor component is fabricated by the method of one of claims 1 to 16.

20. A semiconductor component provided with one or more conductive structural elements which is protected from ambient influences, characterized by the fact that the semiconductor component is fabricated by the method of claim 17 or 18.

* * * * *